US007139990B2

(12) United States Patent
Singh et al.

(10) Patent No.: US 7,139,990 B2
(45) Date of Patent: Nov. 21, 2006

(54) METHOD OF CHECKING THE LAYOUT VERSUS THE SCHEMATIC OF MULTI-FINGERED MOS TRANSISTOR LAYOUTS USING A SUB-CIRCUIT BASED EXTRACTION

(75) Inventors: Raminderpal Singh, Essex Junction, VT (US); Yue Tan, Poughkeepsie, NY (US); Jean-Oliver Plouchart, New York, NY (US); Lawrence F. Wagner, Jr., Fishkill, NY (US); Mohamed Talbi, Poughkeepsie, NY (US); John M. Safran, Wappingers Falls, NY (US); Kun Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 10/807,478

(22) Filed: Mar. 23, 2004

(65) Prior Publication Data
US 2005/0216873 A1    Sep. 29, 2005

(51) Int. Cl.
*G06F 17/50* (2006.01)
(52) U.S. Cl. ............. 716/5; 716/8; 716/9; 716/10; 716/11
(58) Field of Classification Search .......... 716/5, 716/8–11
See application file for complete search history.

(56) References Cited

U.S. PATENT DOCUMENTS

| 5,528,189 A * | 6/1996 | Khatibzadeh ............ 327/314 |
| 6,009,251 A * | 12/1999 | Ho et al. .................. 716/5 |
| 6,553,545 B1* | 4/2003 | Stinson et al. ............ 716/4 |
| 6,683,362 B1* | 1/2004 | O et al. .................. 257/471 |
| 6,760,900 B1* | 7/2004 | Rategh et al. ............ 716/19 |
| 6,851,097 B1* | 2/2005 | Zhang et al. ............. 716/5 |
| 2002/0188920 A1* | 12/2002 | Lampaert et al. .......... 716/10 |
| 2002/0188960 A1* | 12/2002 | Rodriguez et al. ........ 725/120 |
| 2004/0025125 A1* | 2/2004 | Li ....................... 716/5 |
| 2005/0151159 A1* | 7/2005 | Ma et al. ................ 257/152 |

* cited by examiner

*Primary Examiner*—Stacy A Whitmore
(74) *Attorney, Agent, or Firm*—H. Daniel Schnurmann

(57) ABSTRACT

A sub-circuit based extraction method which extracts a multi-finger MOS transistor directly as a sub-circuit is described. By adding three marking layers, the method provides the layout extracted netlist with a complete list of device geometric parameters corresponding to the device properties as presented in the sub-circuit model based schematic netlist. By performing a layout-versus-schematic comparison based on all geometric parameters extracted, the layout checking is performed in a complete and accurate way where each device parameter is checked against the corresponding design schematic. This complete and accurate geometric parameter comparison enhances the confidence level of the layout physical verification.

15 Claims, 7 Drawing Sheets

Figure 1
(Prior Art)
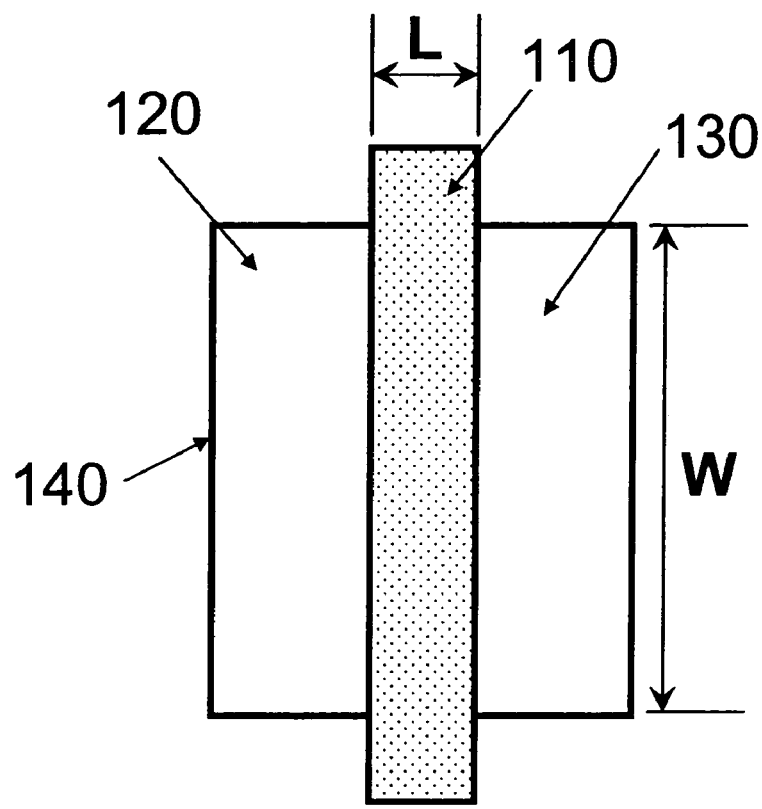
Layout
Schematic
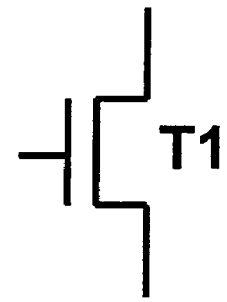
T1 model=NMOS L=L0, W=W0

Figure 2
(Prior Art)
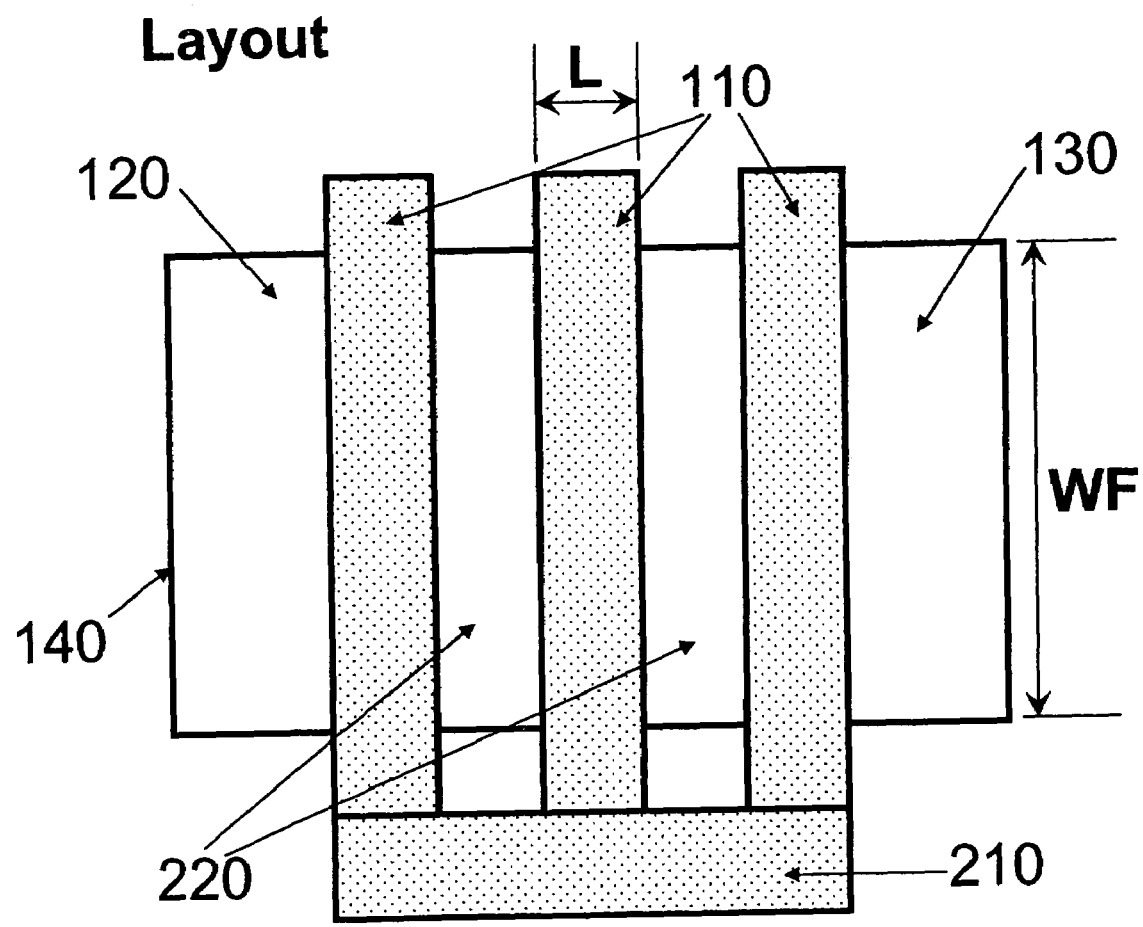
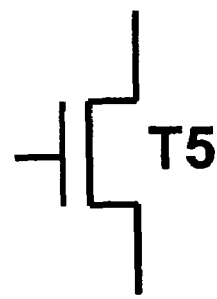
T5 model=NMOS L=L0, W=WF*3

XFET2 model=NFET NF=3, L=L2, WF=WF2,
DIFFL=DIFF2, DIFFM=DIFFM2, DIFFR=DIFFR2

MOS transistor (c) parameters:
L=L1
WF=W1
NF=3
DIFFL=A1
DIFFM=B1
DIFFR=C1

MOS transistor (d) parameters:
L=L2
WF=W2
NF=2
DIFFL=A2
DIFFM=B2
DIFFR=C2

METHOD OF CHECKING THE LAYOUT VERSUS THE SCHEMATIC OF MULTI-FINGERED MOS TRANSISTOR LAYOUTS USING A SUB-CIRCUIT BASED EXTRACTION

BACKGROUND OF THE INVENTION

This invention is generally related to the design of Very Large Scale Integrated Circuit (VLSI) chips and, more particularly, to a method for performing a physical verification of the integrated circuit (IC) layout design.

Physical verification is typically divided into three areas: i) design rules checking, ii) circuit extraction and layout to be compared against a corresponding schematic representation, and iii) parasitic parameter extraction. Of particular interest is finding how the circuit extraction and layout are applied against a schematic (LVS) representation of a multi-fingered MOSFET (Metal-Oxide-Semiconductor Field-Effect-Transistor) layout to improve the confidence level of the physical verification process. Ultimately, the LVS comparison verifies the device layout properties and connectivity against circuit schematics.

As the integration of semiconductor process technology progresses with sub-100 nm lithography and 300 mm multi-part number wafers, the investment for processed wafers demands an increased level of confidence that the physical circuit layouts, (i.e., sets of drawings containing coordinates of rectangles drawn in different layers used to generate the masks for integrated circuit manufacturing) match the intended circuit schematic designs. The schematic or netlist of the circuit is simulated on a Computer Aided Design (CAD) tool to verify the circuit functionality.

A semiconductor integrated circuit layout, including the dimensional accuracy of the pattern shapes, must be efficiently verified with high level of accuracy. The method and the algorithm defining this process provide the aforementioned layout versus schematic verification.

A significant number of patents and publications exist that relate to the physical verification of integrated circuit designs. Typically, only the MOS transistor channel length (L), the channel width (W) or channel width per finger (WF), and the number of fingers (NF) are checked, a process that is globally referred to as flat layout extraction. The aforementioned features are deemed to be the most basic features of the MOS transistor at a level that cannot be broken down any further. This approach is illustrated in FIGS. 1 and 2 as they apply, respectively, to a single finger and to a multi-finger layout. In the invention to be described hereinafter, the channel width of a single finger transistor will be denoted, for sake of simplicity, by the referenced nomenclature WF. In both figures, NF matches the number of gates 110. The prior art that utilizes a layout versus schematic comparison in a hierarchical methodology only applies to a logic gate level design but not to a transistor level design. In contrast, at the transistor level, as will be described hereinafter in the Detailed Description of the Invention, circuits will be broken down into sub-circuits, the sub-circuit consisting of a set of basic circuit elements, such as transistors, resistors, capacitors, and the like, with their corresponding interconnections wherein the combination of such circuit elements does not perform an electrical function. Accordingly, a typical hierarchical structure will consist of basic independent circuit elements, followed by the aforementioned sub-circuits, by a circuit, logic, and the like.

A conventional IC layout extraction and LVS process are shown by way of the prior art flow chart illustrated in FIG. 3. No MOS transistor source and drain diffusion dimensions can be checked when using a flat extraction. It is known in the art that the dimensions of the source and drain diffusion are critical parameters in contemporary VLSI chip designs because the impact of the source and drain parasitic capacitances of the transistor increases dramatically as the transistor feature size is scaled downward. These parasitic capacitances are fully dependent on the dimensions of the source and drain diffusion. As a result, what is needed is a detailed comparison of the layout versus the schematic check that also includes checking the source and drain dimensions. The performance of the circuit being manufactured may deviate significantly from the design target specifications because differences between the physical layout and the circuit schematic are not fully checked. The dimensions of the source and drain diffusion, referenced as "DIFFL", "DIFFM", and "DIFFR" are illustrated in FIG. 4, and are intended to be examples of layout features which can be checked by utilizing the device sub-circuit based extraction method to perform LVS. Also shown therein are three layers referred to "Multi" (410), "Left" (420), and "Right" (430). This cannot be achieved by way of a conventional flat extraction method. As the semiconductor industry continues scaling down the size of the device features to the nanometer region, other transistor geometric parameters such as gate shapes, number of source/drain/gate contacts, and other hybrid devices, e.g., interdigitated differential pairs, will also be required to be checked by way of LVS. The inventive method to be described hereinafter is intended to become a generic method to perform a complete LVS checking for any VLSI design based on the sub-circuit based extraction algorithm.

In three related patents, U.S. Pat. No. 5,831,316, U.S. Pat. No. 5,789,791, and U.S. Pat. No. 6,404,030, a multi-finger MOS transistor layout is described. Comparing the single finger MOS transistor layout shown in FIG. 1, the multi-finger transistor layout shown in FIG. 2 breaks the MOS transistor layout into basic shapes which are placed in parallel with the proper wiring connections (not shown).

U.S. Pat. No. 5,831,316 describes a method of equally positioning the source and drain regions between multi-gates, the base resistance values of parasitic bipolar transistors in each finger MOS being equal to each other. Thus, each finger MOS transistor in the multi-finger MOS transistor is turned on simultaneously to enhance the electrostatic discharge (ESD) protection performance. In the analog and mixed signal circuit domain, the gate resistance of a MOS transistor is one major factor affecting the high frequency performance.

U.S. Pat. No. 5,789,791 describes how the gate resistance of a high-frequency multi-finger MOS transistor is reduced by shorting the ends of each of the gates by utilizing gate contacts, metal regions, vias, and a metal layer.

U.S. Pat. No. 6,404,030 describes the high frequency performance of a MOS transistor which is improved by linking the gates and by forming conductive vias in each gate finger. Therefore, the multi-finger strategy is preferred since it improves the performance of the device by reducing the gate resistance, equalizing the turn-on of each single finger MOS transistor and reducing the area occupied by the MOS transistor. This consideration has long dominated modem IC designs.

U.S. Pat. No. 6,009,252 describes a method for determining equivalencies between integrated circuit schematics and layouts using color symmetrizing matrices. The color symmetrizing matrices that are generated correspond to respective 'child cells' in the circuit schematic. Child cells are characterized by having a number of symmetrical configurations that are electrically equivalent at the port level. The definition of child cells is advantageously used for a hierarchical LVS comparison algorithm. However, two electrically equivalent child cells may be matched inappropriately if the detailed cell attributes are not fully extracted and compared. In most cases, the channel length and width and the number of fingers are attributes to be extracted and compared in a flat extraction and LVS process. Other device attributes, such as the dimensions of the source and drain diffusions, the number of source to drain and drain to gate contacts, and the like, are not extracted and compared altogether. For way of example, FIGS. 5a–5b show transistor and layouts having different geometric dimensions. Explicitly, the dimensions of the source to drain diffusions 120, 130, and 220 differ between (a) and (b) while the channel length L (equal to L0), channel width WF (equal to W0), and number of fingers NF (=3) coincide for both transistors. In the prior art, the extraction and LVS is achieved by extracting L, WF, and NF and comparing these parameters against a schematic netlist that includes among others, a flat model element with L=L0, WF=W0, and NF=3 fully defined. This results in the transistors shown in FIGS. 5a–5b to be successfully matched to an identical schematic cell inappropriately because it is based on a presumption that the two transistors, i.e., FIG. 5a and 5b match each other, which, is incorrect. This is due to information of source and drain diffusion dimensions (DIFFL, DIFFM, and DIFFR) missing in the LVS comparison process.

U.S. Pat. No. 5,712,794 describes an automated method for adding attributes identified on a circuit schematic diagram to an integrated circuit layout. Even though the process of adding an attribute or property of a device can be automated, no mention is made in this patent or other references on how to check the correctness of the added attribute.

Although flat MOS transistor modeling has been used for many decades and it is known that it runs the fastest, it lacks the flexibility and accuracy of a parameterized sub-circuit modeling. The use of sub-circuit models, which are hierarchical models based on flat FET models with technology specific elements and parameters added, has become a standard practice in industry. The parameterized sub-circuit models not only supports useful features such as statistical analysis, but they also increase the accuracy because of additional components such as gate resistance, gate tunneling current, number of device fingers, etc. Examples of features that can be added are: i) Additional circuit elements such as gate resistance, gate to source and drain tunneling current, and a modified body resistance; ii) Geometrical layout parameters so that the dimensions of the transistor can be specified in a more natural way; iii) New instance parameters such as a new set of device dimensions, a different number of device fingers or number of body contacts; iv) Instances when model parameterization can also be applied locally to a sub-circuit, such that local statistical supporting analysis of neighboring device variations can, likewise, be included; and v) Cases where the sub-circuit also allows adding customized features to the model.

Other related references are:

An article by M. Lee, R. B. Anna, Jui-Chu Lee, S. M. Parker, K. M. Newton entitled "A scalable BSIM3v3 RF model for multi-finger NMOSFETs with ring substrate contact", published in the 2002 IEEE International Symposium on Circuits and Systems, Vol. 5, May 2002, pp 221–224, there is described a scalable RF (Radio Frequency) sub-circuit MOS transistor model using a commercial modeling tool to support a simple RC (Resistance and Capacitance) substrate network with well defined intrinsic parasitic parameters for Scattering Parameter (also referred to as an S-parameter, a common measure in RF technology) scalability. It is claimed that using a sub-circuit modeling strategy provides accurate and scalable modeling capability for high performance RF circuit design.

A gate level sub-circuit extraction algorithm is described in an article by W.-H. Chang, S. D. Tzeng, C. Y. Lee, entitled "A novel sub-circuit extraction algorithm by recursive identification scheme", published in the 2001 IEEE International Symposium on Circuits and Systems, Vol. 5, May 2001, pp 491–494. Based on a recursive graph identification scheme, the proposed sub-circuit extraction algorithm can decrease the run time significantly and is technology independent.

Articles by N. Vijaykrishnan, N. Ranganathan, entitled "SUBGEN: a genetic approach for sub-circuit extraction", published in the 1996 Ninth International Conference VLSI Design, January 1996, Pages: 343–345 and by Z. Ling, D. Y. Y. Yun, entitled "An efficient sub-circuit extraction algorithm by resource management", published in the 1996 Second International Conference on ASIC, October 1996, pp. 9–14, describes a sub-circuit extraction algorithm to identify a sub-circuit in a large scale integrated circuit layout. The algorithm described by N. Vijaykrishnan et al. begins with a random population potential match and details a so-called genetic representation algorithm. In the paper by Z. Ling et al., an efficient approach is described to solve the subgraph isomorphism problem based on the resource management paradigm is transformed to extract sub-circuit.

An article by G. Yokomizo, C. Yoshida, M. Miyama, Y. Motono, K. Nakajo, entitled "A new circuit recognition and reduction method for pattern based circuit simulation", published in the 1990 IEEE Custom Integrated Circuits Conference, May 1990, pp. 9.4/1–9.4/4, a circuit recognition and reduction method to extract sub-circuit data corresponding to the critical path is described. When including all relevant parasitics and internal loading, the critical path can be optimized and the design can be improved substantially.

Comparing the combined methods described by W.-H. Chang et al., N. Vijaykrishnan et al., Z. Ling et al., to the method described by Yokomizo et al., the latter takes one more step, i.e., the circuit reduction, to further simplify the extracted sub-circuit when finding a critical path. However, the sub-circuit described in the combined publications is a combination of several MOS transistors and/or resistors, etc., but not a transistor level representation that can be used to improve the geometric property comparison accuracy.

Finally, the article by W. Kim, H. Shin, entitled "Hierarchical LVS based on hierarchy rebuilding" and published in the 1998 Design Automation Conference. February 1998, pp. 379–384, described a method for extracting sub-circuit(s) from a VLSI design and then performing layout versus schematic comparison hierarchically. Experimental results show that this technique is effective and efficient regarding CPU time and memory usage. Once again, since the sub-circuit usage at the transistor level is not suggested, the hierarchical LVS only provides increased accuracy and efficiency on the circuit connectivity verification. Increasing the accuracy of device property checking can only be achieved by using the sub-circuit based LVS method as proposed in this invention, where each critical property or parameter in a transistor sub-circuit level has to be compared and matched.

The typical prior art flat extraction method is described below. Referring back to prior art FIG. 1 there is shown a flat modeled single finger MOS transistor layout. The extraction obtains the gate pattern and node from the interaction of polysilicon gate 110 and active region 140. The source and drain (120 and 130, swappable) are then extracted by the difference of 140 and 110. Then the extracted netlist can be written as Netlist (1).

T1 (GNode, SNode, DNode) model=NMOS L=L0,
    W=W0,                                              (1)

where T1 is a sequence name of the transistor observing a particular naming rule in a particular electronic design tool. Each electrical node is defined in parenthesis where GNode represents Gate, SNode for Source and DNode for Drain. Since the electrical connectivity extraction and checking is not within the scope of the invention, it is assumed that the electrical nodes of the gate, source, and drain of the MOS transistor will be referred to as GNode, SNode, and DNode, respectively. The node definitions in parenthesis are followed by "model=" and "NMOS", which is the model name of the extracted transistor, i.e., a flat model or sub-circuit model. The device properties of channel length (L) and channel width (WF) are calculated and listed accordingly. After the netlist is generated and the properties extracted, LVS is initiated to compare the node connections and property values. In the present case, only the channel length and width will be compared against the design schematic values.

Referring now back to FIG. 2, there is shown a multi-finger layout where three polysilicon gate fingers 110 break the entire active diffusion 140 in four sections, 120, two of 220, and 130. Another horizontal polysilicon bar 210 joins the three fingers 110, making the three gate fingers transistor wired as one. In case of a multi-finger layout, a conventional method extracts three MOS transistors as Netlists (2)–(4), i.e., T2 (GNode, SNode, DNode) model=NMOS L=L0,
    WF=W0                                              (2)

T3 (GNode, SNode, DNode) model=NMOS L=L0,
    WF=W0                                              (3)

T4 (GNode, SNode, DNode) model=NMOS L=L0,
    WF=W0                                              (4)

The extracted transistors look exactly the same to each other except for different notation names. Usually, after the primitive extraction, most LVS tools perform a reduction process intended to merge all the devices connected in parallel (the source and drain wiring are not shown) to one device. In this case, the final extracted netlist will be like Netlist (5).

T5 (GNode, SNode, DNode) model=NMOS L=L0,
    W=Wall,                                            (5)

where Wall=3W0, since the three devices are in parallel. It will be noticed that, in both examples, critical model properties such as the number of fingers (NF) are not extracted and compared. Moreover, it is not possible to compare additional device features such as diffusion segment dimensions, which typically have a significant impact on the device and circuit performance.

The problem solved by the invention is that LVS checks all the layout geometric parameters after performing a sub-circuit based extraction. The prior art for the general layout physical verification process is shown in FIG. 3. The layout extraction and LVS process (310) need to be performed after the layout is completed. If the comparison shows that the layout is correct, i.e., the extracted netlist is equivalent to the schematic netlist, the physical verification branches to the "parasitic extraction" stage 360. When the post-layout simulation results satisfy the design specification, the complete physical verification process is terminated and is followed by the tape-out process (i.e., formalizing a verified layout and readying it for mask generation).

As shown in FIG. 3, present solutions typically only recognize devices as a group of flat basic components like resistors and single finger MOS transistors represented by "Flat extraction" 320. In addition to breaking the design coherence with the schematic by recognizing a single device as multiple primitive elements, this practice leads to simulation inefficiencies downstream requiring an iterative solution of multiple elements instead of a single sub-circuit device model. Simulation efficiency may be improved by merging the primitive elements, as discussed above for Netlist (5), but important structural details may be lost in the merge. This practice only partially works for a multi-finger layout because the critical device property "number of fingers" cannot be checked. The single finger device of FIG. 1 and the three-finger device of FIG. 2 after reduction achieves the same result as Netlist (5) even though individually they perform differently from one another. Certain advanced algorithms handle the property "number of fingers" by using a multiplicity factor but no other geometric parameters, such as source and drain diffusion dimensions are extracted and compared during LVS. No known solution has been disclosed to solve the general layout geometric parameter extraction and LVS.

In summary, LVS is a critical step in the physical verification phase of the IC design process. Known solutions cannot extract a complete list of geometric parameters of a transistor and perform a complete parametric and connectivity verification. The invention solves this problem by incorporating three additional marking layers and utilizing a sub-circuit based extraction algorithm to extract a complete list of transistor geometric parameters. Followed by the sub-circuit based LVS method, the stated shortage of current extraction and LVS is resolved, resulting in an improved match of the IC layout to the design specification.

OBJECTS AND SUMMARY OF THE INVENTION

Accordingly, it is an object of the invention to perform an IC layout extraction using an improved sub-circuit method so that all the device geometric parameters can be properly and completely extracted.

It is another object to perform a layout versus schematic comparison based on the improved sub-circuit extraction method so that the LVS is complete and accurate to satisfy the high confidence level required for physical verification in an advanced IC design.

The steady down scaling of semiconductor device dimensions has been the main stimulus to the growth of microelectronics and computer aided VLSI design. The more an IC is scaled down, the higher its packing density becomes. The increasing size of chips, measured in either area or number of transistors, and the misuse of the large capital investment in fabricating and testing circuits that do not work, makes the layout analysis and verification an important part of physical design automation.

The inventive method treats a multi-fingered MOSFET layout as one entity, modeled as a sub-circuit. The method extracts as many geometric parameters as the sub-circuit model defines in the entity, and then compares these parameters against the schematic netlist. This method enables layout versus schematic comparison to be achieved in a more accurate and efficient way. To implement the invention, a minimum number of three marking layers are added to each MOS transistor layout.

In one aspect of the invention there is described an algorithm that fully supports the multi-fingered FET layout design. In contrast with the prior art, existing solutions extract each gate (polysilicon crossing active diffusion) as a seed layer, whereas the inventive method extracts a multi-finger FET as one entity. The prior art combines fingers in one entity that lacks the necessary information required to perform a complete LVS check (i.e., the number of fingers property is dropped during the reduction process, and the source and drain diffusion information is missing in the extraction process). Since the inventive method treats a multi-finger FET as one entity, it extracts as many properties as defined in the sub-circuit model (a simple list of the properties includes the channel length and width, the number of fingers, source and drain diffusion dimensions, and the like) and then compares these properties against the schematic netlist. With this method, the extracted properties are complete and the comparison process finds any discrepancies between the layout and schematic for all parameters defined in the model. This approach produces the most accurate comparison result.

In another aspect of the invention, the algorithm treats each FET as a sub-circuit and not as a flat MOSFET device and the sub-circuit based netlist resembles a schematic netlist. This is critical for passing many parameters (i.e., the number of fingers, drain and source diffusion geometries, local statistics, etc.) needed by the netlister/simulator for a downstream simulation and analysis. It also includes all the device properties in the extraction and comparison which translates into a more accurate verification and simulation.

Finally, the parasitic device extraction and post-layout simulation (360 in FIG. 3) accuracy also benefits from the disclosed algorithm. Because this invention yields a more meaningful and understandable extracted netlist, parasitic device extraction can be performed more efficiently and accurately. The majority of the parasitic extraction task focuses on the extrinsic parasitics (i.e., the wiring and substrate effects, etc.) which depend on the device interconnects, while leaving the intrinsic parasitics (i.e., the gate resistance, contact resistance, junction capacitance, etc.) to be handled by the sub-circuit models. This leads to a fast and accurate post-layout simulation downstream while making it easier to identify how interconnect or device related layout impacts circuit performance.

The invention provides a method of performing a physical verification of the layout of an integrated circuit that includes the steps of: a) identifying transistors in a sub-circuit configuration that includes respective interconnections linked to each of the transistors; b) measuring parameters of each of the sub-circuits; c) comparing the measured parameters of each of the sub-circuits against corresponding parameters of a schematic netlist; and d) determining if all of said comparisons returns a correct correlation, and reporting when any of said comparisons returns a mismatched.

BRIEF DESCRIPTION OF THE DRAWINGS

The accompanying drawings, which are incorporated in and which constitute part of the specification, illustrate presently preferred embodiments of the invention and, together with the general description given above and the detailed description of the preferred embodiments given below serve to explain the principles of the invention.

FIG. 1 shows a one finger MOSFET layout and device parameters which are typically used for a prior art layout versus a schematic check.

FIG. 2 shows a multi-finger MOSFET layout and device parameters which are typically used in a prior art layout versus a schematic check, where limitations of the conventional check are illustrated.

DETAILED DESCRIPTION OF THE INVENTION

The invention will now be described first by way of extracting all the geometric parameters of a MOS transistor layout to be followed by a description of performing the sub-circuit based layout versus schematic comparison.

Figure 4:
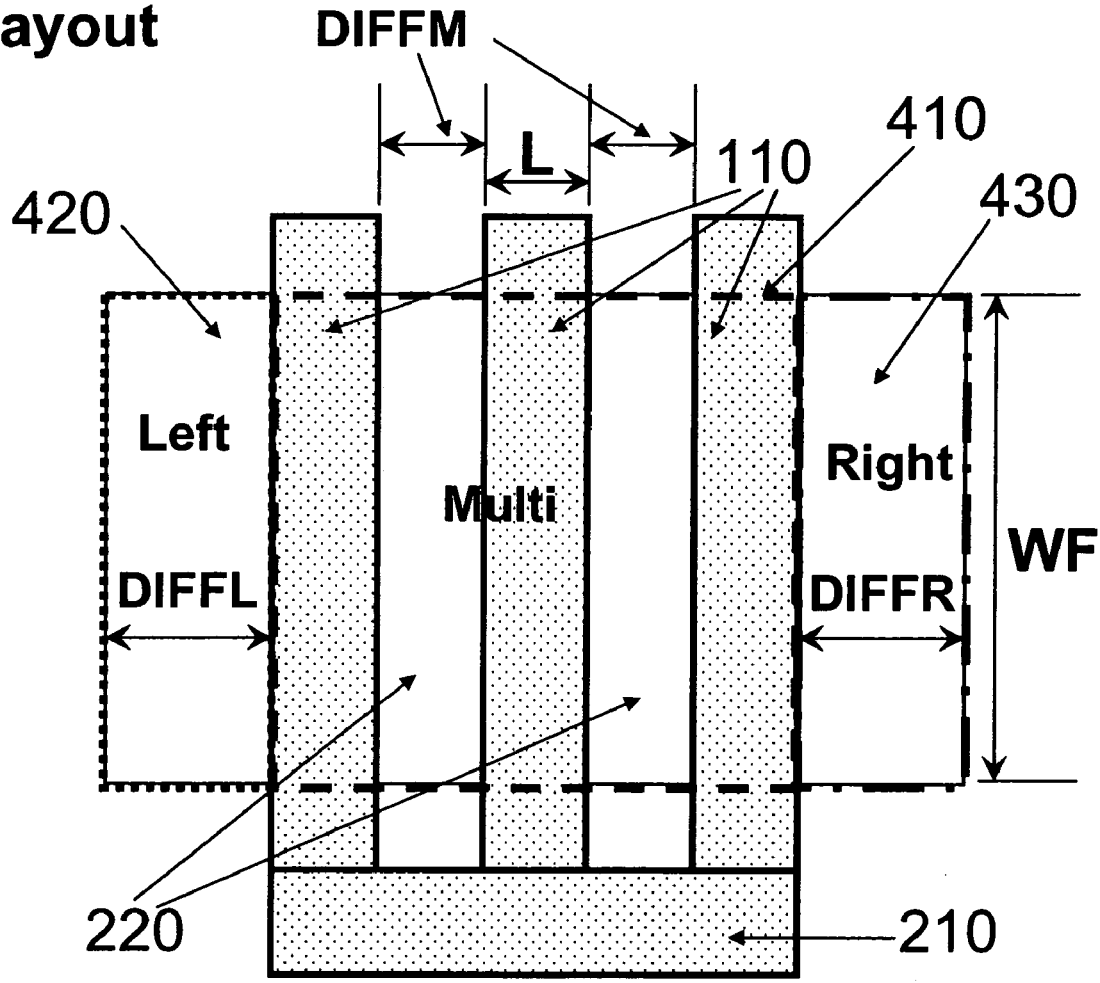
FIG. 4 illustrates a multi-finger MOSFET with proposed auxiliary marking layers to define a complete set of transistor geometric parameters, according to the present invention.
Figure 5:
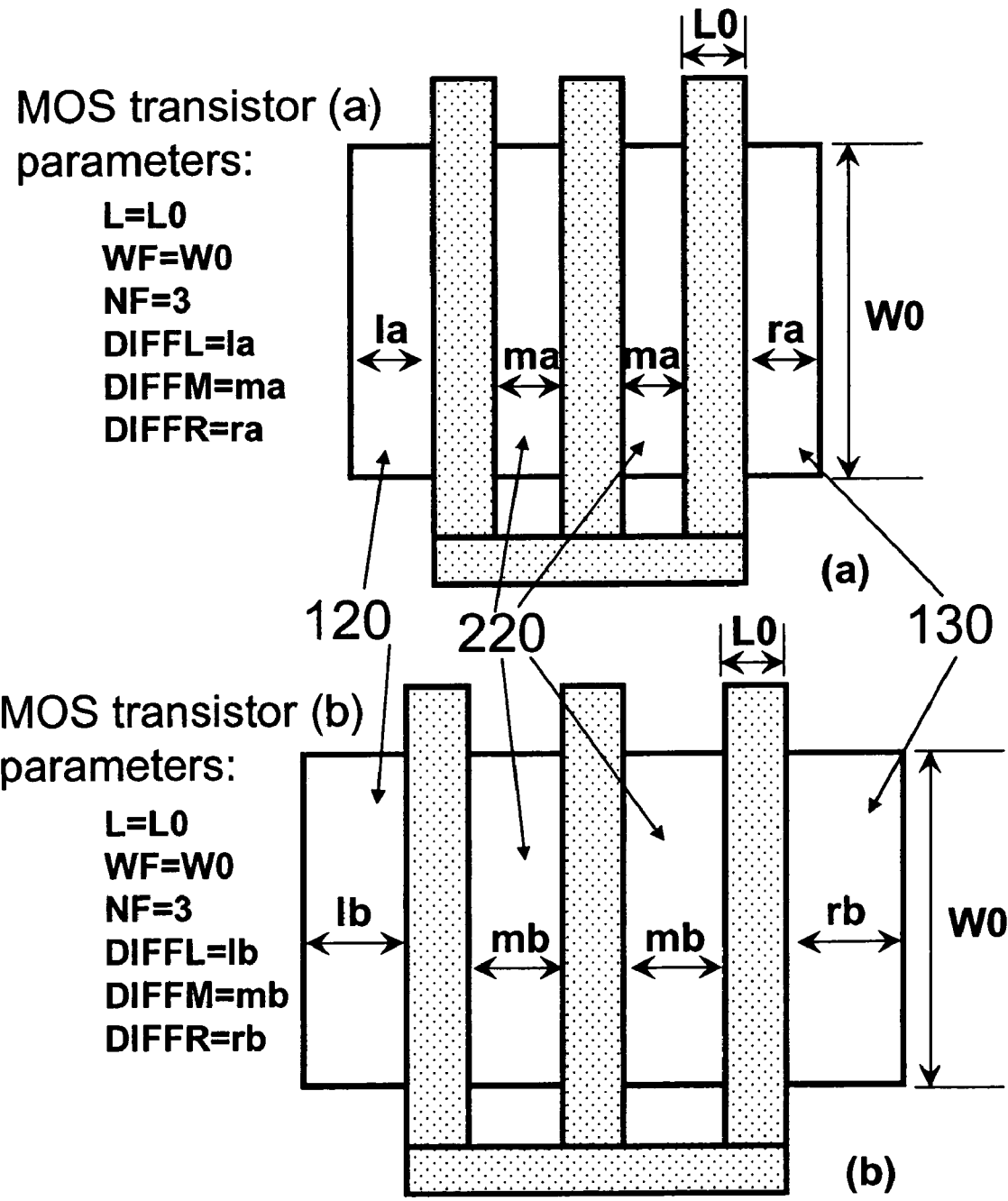
FIG. 5 shows a test case where the conventional layout extraction and LVS process fails to check the mismatch.

The main thrust of the invention is to extract the multi-fingered MOS transistor as one sub-circuit entity with all the geometric parameters such as the channel length and width, number of fingers, source and drain diffusion dimensions, and appropriate node connections included in the extracted netlist. To illustrate the inner workings of the invention, a parameterized sub-circuit MOS transistor with multi-finger layout is shown in FIG. 4. The geometric parameters are channel length "L", channel width per finger "WF", number of fingers "NF" (number count of 110s), left-side diffusion dimension "DIFFL", right-side diffusion dimension "DIFFR", and middle diffusion dimension "DIFFM". The parameters "L", "WF", and "NF" are the same as those of a flat MOS transistor model. The total MOS transistor channel width is calculated by multiplying "WF" to "NF". "NF" also calculates the gate resistance in the sub-circuit model. When compared with the conventional flat extraction shown in FIG. 2, three new geometrical layout parameters, "DIFFL", "DIFFR", and "DIFFM", are introduced and used to calculate the MOS transistor source and drain diffusion dimensions 220, 420, and 430. In this case, including these three geometric parameters in the extracted netlist completes the extracted information of the MOS transistor layout. This is the starting point for making the layout versus schematic complete and accurate.

The key to recognizing a sub-circuit based MOS transistor and comparing each parameter and the connectivity of the parameterized sub-circuit is to treat the multi-finger sub-circuit based MOS transistor as one entity. This eliminates the reduction process of known LVS solutions, by which critical parameters such as number of fingers and diffusion dimensions are dropped or ignored. In order to make the algorithm operate with any LVS tool and for complicated layouts (i.e., layouts containing single-fingered or multi-fingered, flat model or sub-circuit model based, single or abutting devices), three LVS marking layers are added to the MOS transistor layout. They are: "Multi" (410, shapes with dashed line), "Left" (420, dotted-line), and "Right" (430, stippled line) as shown in FIG. 4. These three shapes are the minimum required to handle any layout. The "Multi" (410) marking shape coincides with the outermost edges of all gates where they intersect the active diffusion region, and covers the diffusions between the gates of the multi-fingered devices. The "Left" (420) marking layer covers the left side diffusion while "Right" (430) covers the right side. Using "Left" and "Right" for marking layer names preserves the source and drain swappability of the extracted netlist, which is important for checking the connectivity.

In most cases, the first step when extracting a device is to define its corresponding recognition layer or seed layer. The recognition layer is a physical or derived layer used to recognize a particular device. Pin layers and other auxiliary layers are also necessary to be defined by way of the recognition layer to derive or extract all the device properties. The basic constraint for the pin and auxiliary layers is that they physically contact the recognition layer. The sub-circuit modeled MOS transistor depicted in FIG. 4 has the same pins as a flat MOS transistor (gate, source, and drain), although more pins can be added to satisfy accurate modeling such as body and substrate pins in a SOI (Silicon-On-Insulator) technology.

The following Boolean operations will generate all the necessary pins and device properties for the multi-fingered sub-circuit based MOS transistor.

```
MULTI = 410
PC = 110 OR 210
RX = (410 OR 420) OR 430
LEFT = 420
RIGHT = 430
FET_RECOG = MULTI TOUCH (PC AND RX)
CHAN = MULTI AND (PC AND RX)
SD = (RX TOUCH MULTI) NOT PC
DIFF_L = LEFT AND SD
DIFF_R = RIGHT AND SD
NF = COUNT(CHAN)
L = (PERIMETER(CHAN) −
PERIMETER_COINCIDE(CHAN, SD))/(2*NF)
W = PERIMETER_COINCIDE(CHAN, SD)/2
WF = W/NF
DIFFL = AREA(DIFF_L)/WF
DIFFR = AREA(DIFF_R)/WF
IF (NF > 1) {
DIFFM=((AREA(MULTI)/WF)−(NF*L))/(NF−1)
} ELSE { DIFFM = 0 }
```

The device recognition layer FET_RECOG is defined by MULTI which contacts the area crossing PC and RX. The channel layer CHAN is defined by intersecting MULTI, PC with RX. There is more than one CHAN shape in a multi-fingered MOS transistor. The source and drain layer SD is defined by RX not intersecting PC, as it is usually the case. Left and right diffusions DIFF_L and DIFF_R are defined by the intersection of LEFT/RIGHT and SD, respectively.

After properly defining the recognition layer, the pin layers, and the auxiliary layers, all the device parameters NF, L, WF, DIFFL, DIFFM, and DIFFR are calculated accordingly. The extracted netlist can then be generated as Netlist (6).

XFET1 (GNode SNode DNode) model=NFET
NF=NF1, L=L1, WF=WF1, DIFFL=DIFFL1,
DIFFM=DIFFM1, DIFFR=DIFFR1         (6)

After properly extracting all the geometric parameters, a sub-circuit based LVS process is performed to check the extracted device parameters and the corresponding connectivity information against the schematic netlist. To perform a sub-circuit based LVS, a schematic netlist built from a sub-circuit model is required. An illustrative sub-circuit based schematic netlist is shown in Netlist (7).

XFET2 (GNode SNode DNode) model=NFET
NF=NF2, L=L2, WF=WF2, DIFFL=DIFFL2,
DIFFM=DIFFM2, DIFFR=DIFFR2         (7)

By comparing Netlist (6) to (7), it can be seen that the extracted netlist resembles the schematic netlist generated from a sub-circuit model approach. This results in a simple and feasible LVS verification process for a multi-fingered MOS transistor layout in a sub-circuit based design. Since each netlist includes all the geometric parameters that need to be checked with all the parameters corresponding to each other, the LVS verification will be a complete and accurate comparison.

Figure 3:
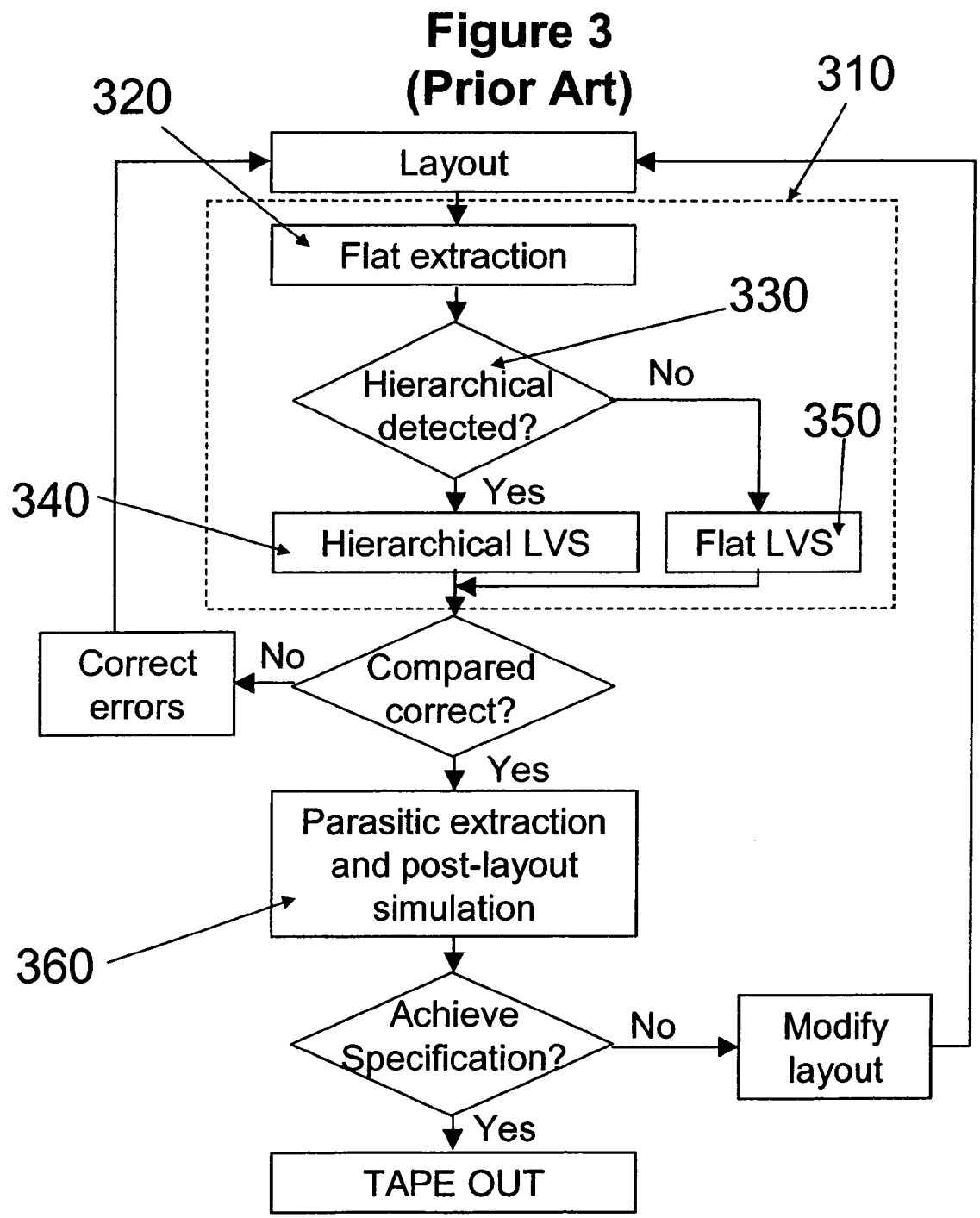
FIG. 3 is a flow chart used in a prior art process for the integrated circuit layout physical verification.
Figure 6:
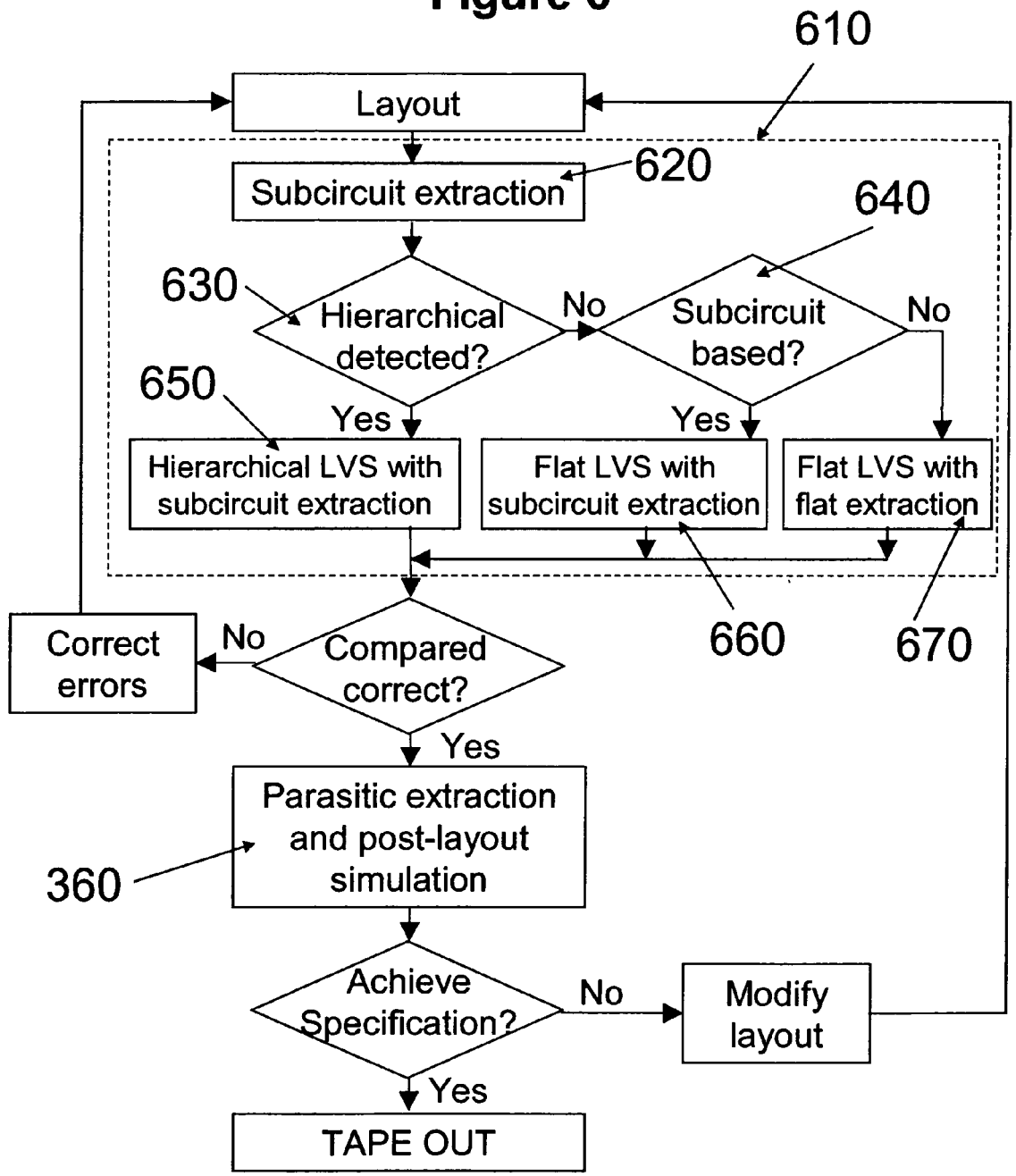
FIG. 6 is a flow chart showing the integrated circuit layout physical verification process, in accordance with the present invention.

FIG. 6 provides a flow chart of the layout extraction and LVS comparison process with the inventive sub-circuit based extraction and LVS method. When it is compared to the prior art shown in FIG. 3, the difference between the two flow charts resides in replacing the process flow 310 in FIG. 3 with process flow 610 in FIG. 6. By substituting the "flat extraction" 320 with the "sub-circuit extraction" 620, the layout extraction function block is significantly more powerful since it is able to handle not only flat extractions but also sub-circuit based extractions. As a result, the LVS comparison function block is enhanced to support the "Hierarchical LVS with sub-circuit based extraction" 650, "Flat LVS with sub-circuit based extraction" 660, and "Flat LVS with flat extraction" 670, instead of the present solution shown in FIG. 3: "Hierarchical LVS with flat extraction" 340 and "Flat LVS with flat extraction" 350. This enhancement not only brings the sub-circuit based extraction into the LVS process, but it also categorizes LVS by way of decision blocks "Hierarchical detected?" 630 and "Sub-circuit based?" 640. These are categorized into three different process flows according to the hierarchy and the extraction methods. In this manner, LVS is performed more efficiently by using a target oriented (i.e. hierarchical or flat, sub-circuit or flat model) optimized algorithm.

Figure 7:
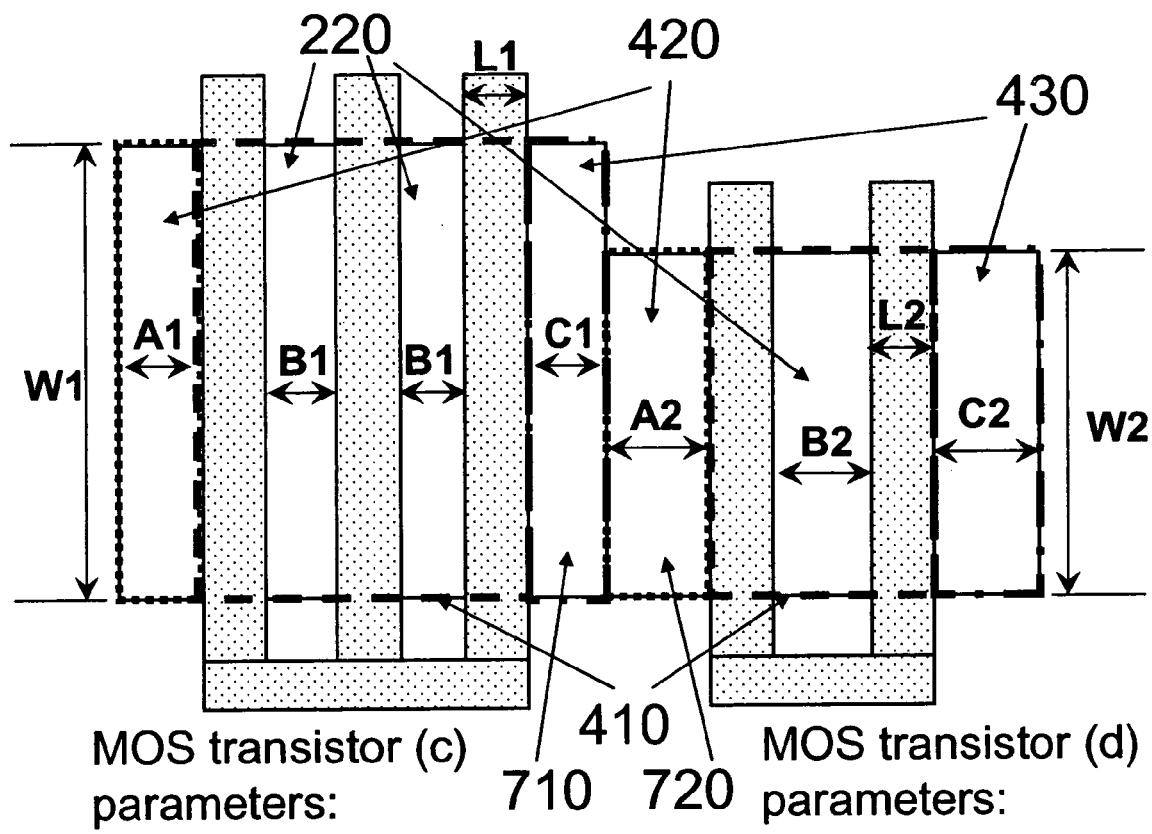
FIG. 7 shows an abutting junction test case where three marking layers to be added to the MOS transistor layout is the minimum requirement to properly extract all layout geometric parameters of the transistor.

FIG. 7 illustrates a complex layout example, wherein two MOS transistors abut each other to form a series connection with three marking layers added to each MOS transistor layout, namely dashed line 410, dotted line 420, and stippled line 430. By using the prior art extraction algorithm, the channel length and width, and the number of fingers can be extracted without adding any auxiliary marking layers. In order to measure the diffusion dimensions of 220, marking shapes 410 are added to distinguish the inside diffusion area 220 from the outside diffusion area 420 and 430. In the case of two transistors abutting together as depicted in FIG. 7, the outside diffusion area 710 of transistor (c) must be distinguished from the outside diffusion area 720 of transistor (d). It is obvious that without adding marking shapes 420 and 430 to each transistor, outside diffusion area 710 and 720 will be considered and measured as a single diffusion area. When taking the dimension of the single diffusion area into the extracted netlist, prior art methodologies either overestimate the dimensions of the transistor's source/drain while ignoring the others, or both source/drain dimensions are miscalculated by equally distributing the total area to each one of them. Therefore, by adding marking layers 410, 420, and 430, all the MOS transistor geometric parameters can be measured and extracted properly as Netlists (8) and (9).

```
XMOSC (GNode SNode DNode) model=NFET
    NF=3, L=L1, WF=W1, DIFFL=A1,
    DIFFM=B1, DIFFR=C1                    (8)

XMOSD (GNode SNode DNode) model=NFET
    NF=2, L=L2, WF=W2, DIFFL=A2,
    DIFFM=B2, DIFFR=C2                    (9)
```

It can now be concluded that the minimum requirement to properly extract all the layout geometric parameters of the transistor is by adding three auxiliary marking layers 410, 420, and 430 to each MOS transistor layout.

In summary, the present invention extracts a multi-finger MOS transistor (also known as logical transistor) directly as a sub-circuit as opposed to known solutions which extract one finger at a time (also known as a physical transistor) and perform the reduction on parallel gates. By adding three marking layers, the method provides the layout extracted netlist with a complete list of device geometric parameters corresponding to the device properties as presented in a sub-circuit based schematic netlist. As described in a highly complex layout example of two multi-finger devices with junctions abutted, adding the three marking layers is proposed as the minimum requirement to measure and extract all geometric parameters. The extraction with complete geometric parameters makes the layout versus schematic comparison more complete and accurate such that the layout physical verification confidence is significantly enhanced.

Whereas the present invention has been described in terms of several preferred embodiments, it will be understood by those skilled in the art that numerous changes and modifications to the algorithm may be introduced without departing from the spirit of the invention. Accordingly, the present invention is intended to embrace all such alternatives which fall within the scope of the appended claims.

What is claimed and desired to be secured by Letter Patents is:

1. A method of performing a physical verification of the layout of an integrated circuit comprising the steps of:
    identifying transistors in a sub-circuit configuration that includes respective interconnections linked to each of said transistors;
    measuring parameters of each of said sub-circuits, and comparing the measured parameters of each of said sub-circuits against corresponding parameters of a schematic netlist; and
    determining if all of said comparisons returns a correct correlation, and reporting when any of said comparisons returns a mismatched correlation, said comparison being performed in a sub-circuit extraction mode when said transistor is identified as a sub-circuit; otherwise, said comparison being performed in a flat extraction mode.

2. The method of claim 1, wherein said transistor in said layout is a single fingered field-effect transistor (FET).

3. The method of claim 1, wherein said transistor in said layout is a multi-fingered field-effect transistor (FET).

4. The method of claim 3, wherein the measured parameters of said multi-fingered transistor are respectively compared to corresponding parameters of said schematic netlist.

5. The method of claim 3, wherein said FET transistor comprises at least two gate regions shorted to each other, at least one drain and two source diffusion regions, said two source diffusion regions being shorted to each other, or at least one source and two drain diffusion regions, said two drain diffusion regions being shorted to each other.

6. The method of claim 5, wherein said layout includes first marker shapes to identify said source or drain diffusion regions between pairs of said FET gate regions.

7. The method of claim 6, wherein said layout includes second marker shapes to identify said source or drain diffusion regions occurring outside said pairs of FET gate regions.

8. The method of claim 7, wherein said first and second marker shapes are used to form a netlist for said FET transistor.

9. The method of claim 1, wherein said comparison of the measured parameters of each of said sub-circuits against the corresponding parameters of the schematic netlist further comprises comparing the diffusion dimensions of the source and the drain of said transistor to said schematic netlist.

10. A method for creating a device layout comprising the steps of:
    providing device model parameters that support an extraction of a list of device layout geometric parameters, said device model parameters comprising channel length (L), finger width (WF); number of fingers (NF), left diffusion length (DIFFL), middle diffusion length (DIFFM), and right diffusion length (DIFFR) of an FET transistor; and
    providing specific marker shapes to define the device layout geometric parameters.

11. The method of claim 10, wherein a minimum set of three FET transistor marker shapes (LEFT, MULTI, and RIGHT) are used for bulk Si and SOI technologies.

12. The method of claim 10, wherein said devices are selected from the group consisting of bipolar junction transistors (BJT), hetero-junction bipolar transistors (HBT), and compounded semiconductor transistors.

13. The method of claim 10, wherein further marker shapes are added to non-FET devices to perform a sub-circuit based extraction.

14. The method of claim 13, wherein non-FET devices are selected from the group consisting of integrated on-chip inductors, integrated on-chip capacitors, resistors, and varactors.

15. A program storage device readable by a machine, tangibly embodying a program of instructions executable by the machine to perform method steps for performing a physical verification of the layout of an integrated circuit, said method steps comprising:
    identifying transistors in a sub-circuit configuration that includes respective interconnections linked to each of said transistors;
    measuring parameters of each of said sub-circuits, and comparing the measured parameters of each of said sub-circuits against corresponding parameters of a schematic netlist; and
    determining if all of said comparisons returns a correct correlation, and reporting when any of said comparisons returns a mismatched correlation, said comparison being performed in a sub-circuit extraction mode when said transistor is identified as a sub-circuit; otherwise, said comparison being performed in a flat extraction mode.

* * * * *